United States Patent
Bao et al.

(10) Patent No.: US 6,812,043 B2
(45) Date of Patent: Nov. 2, 2004

(54) METHOD FOR FORMING A CARBON DOPED OXIDE LOW-K INSULATING LAYER

(75) Inventors: Tien-I Bao, Hsin-Chu (TW); Chung-Chi Ko, Hsin-Chu (TW); Lih-Ping Li, Hsin-Chu (TW); Syun-Ming Jang, Hsin-Chu (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 0 days.

(21) Appl. No.: 10/131,713

(22) Filed: Apr. 25, 2002

(65) Prior Publication Data

US 2003/0203652 A1 Oct. 30, 2003

(51) Int. Cl.[7] ......................... H01L 21/00; H01L 21/469
(52) U.S. Cl. ......................... 438/4; 438/475; 438/779; 438/784; 438/798
(58) Field of Search ......................... 438/779, 784, 438/475, 798, FOR 117, FOR 148, 4

(56) References Cited

U.S. PATENT DOCUMENTS 5,691,238 A * 11/1997 Avanzino et al. .......... 438/618
6,054,379 A * 4/2000 Yau et al. .................. 438/623
6,114,259 A * 9/2000 Sukharev et al. .......... 438/789

* cited by examiner

Primary Examiner—George Fourson
Assistant Examiner—Than V Pham
(74) Attorney, Agent, or Firm—Tung & Associates

(57) ABSTRACT

A method for forming a dielectric insulating layer with a reduced dielectric constant and increased hardness for semiconductor device manufacturing including providing a semiconductor wafer having a process surface for forming a dielectric insulting layer thereover; depositing according to a CVD process a carbon doped oxide layer the CVD process including an oregano-silane precursor having Si—O groups and Si—$R_y$ groups, where R is an alkyl or cyclo-alkyl group and y the number of R groups bonded to Si; and, exposing the carbon doped oxide layer to a hydrogen plasma treatment for a period of time thereby reducing the carbon doped oxide layer thickness including reducing the carbon doped oxide layer dielectric constant and increasing the carbon doped oxide layer hardness.

26 Claims, 2 Drawing Sheets

METHOD FOR FORMING A CARBON DOPED OXIDE LOW-K INSULATING LAYER

FIELD OF THE INVENTION

This invention generally relates to semiconductor device manufacturing methods and more particularly to methods for forming a carbon doped oxide low-k insulating layer.

BACKGROUND OF THE INVENTION

In semiconductor fabrication, various layers of insulating material, semi conducting material and conducting material are formed to produce a multi-level semiconductor device. One of the limiting factors in the continuing evolution toward smaller device size and higher density has been signal delay caused by parasitic effects of insulating materials in which metal interconnects are formed to interconnect devices. It has become necessary to reduce capacitance of the insulating layers to allow the insulating layer thicknesses to shrink along with other device features such as metal interconnect line width. As a result, the need for lower dielectric constant materials has resulted in the development of several different types of organic and inorganic low-k materials.

During the formation of semiconductor devices it is often required that the conductive layers be interconnected through holes in an insulating layer. Such holes are commonly referred to as contact holes when the hole extends through an insulating layer to an active device area, or visa, when the hole extends through an insulating layer between two conductive layers.

Manufacturing processes such as, for example, damascene processes, have been implemented to form metallization visa and interconnect lines (trench lines) by dispensing entirely with the metal etching process. The damascene process is a well known semiconductor fabrication method for forming multiple layers of metallization visa and interconnect lines. For example, in the dual damascene process, a trench opening and via opening is etched in one or more insulating layers also known as an inter-metal or inter-level dielectric (IMD/ILD) layers. The insulating layers are typically formed over a substrate including another conductive area over which the visa and trench lines are formed to provide electrical communication. After a series of photolithographic steps defining via openings and trench openings, via and the trench openings are filled with a metal, preferably copper, to form visa and trench lines, respectively. The excess metal above the trench line level is then removed by well known chemical-mechanical planarization (polishing) (CMP) processes.

As indicated, advances in semiconductor device processing technology demands the increasing use of low-k (low dielectric constant) insulating materials in, for example, inter-metal dielectric (IMD) layers that make up the bulk of a multi-level device. In order to reduce signal delays caused by parasitic effects related to the capacitance of insulating layers, for example, IMD layers, incorporation of low-k materials with dielectric constants less than about 3.0 technology has become standard practice as semiconductor feature sizes have diminished to 0.13 microns. As feature sizes decrease below 0.13 microns, materials with dielectric constants less than about 2.5 will be required. Many of the low-k materials are designed with a high degree of porosity to allow the achievement of lower dielectric constants. Several different organic and inorganic low-k materials have been developed and proposed for use in semiconductor devices as insulating material having dielectric constants less than about 3.0 for achieving device integration in, for example, 0.13 micron interconnections. An exemplary low-k material that is increasingly being proposed for 0.13 micron technology and below, for example, is carbon doped oxide (C-oxide) also known as oregano silicate glass (OSG) formed by a CVD process including where the dielectric constant may be varied over a range depending on the precursors and process conditions. C-oxide, for example, may be formed with dielectric constants over a range of about 2.0 to about 3.0 and density of about 1.3 $g/cm^3$ compared to dielectric constants of about 4.1 and a density of about 2.3 $g/cm^3$ for silicon dioxides (e.g., un-doped TEOS).

As might be expected, the development of porous low-k materials has presented several problems in manufacturing methods that must be overcome. Among the problems presented by carbon doped oxide are low strength and proclivity to cracking or peeling in subsequent stress-inducing manufacturing processes including, for example, chemical mechanical planarization (CMP) However, as the dielectric constant decreases, there is a concomitant decrease in hardness. Lower hardness films present serious integration challenges as result of lower adhesion to other films and CMP incompatibility. Above a critical layer thickness of the carbon doped oxide, depending on the hardness of the carbon doped oxide and the induced stresses, the carbon doped oxide becomes susceptible to cracking causing catastrophic failure of the insulating layer. Approaches to protect the low-k insulating material layers, have included the practice to add a capping layer over the insulating layer including for example, silicon nitride (e.g., SiN), silicon oxynitride (e.g., SiON) or silicon carbide (SiC). While capping layers have had some success, the addition of the capping layers contributes undesirably to the overall capacitance of the multi-level device. In addition, the capping layers have not been fully effective in preventing crack initiation and propagation through carbon dope oxide layers due to its relatively high brittleness. Other approaches to decrease the cracking susceptibility of the carbon doped oxide layers has been hybrid multiple layered insulating layers composed of, for example, alternating layers of carbon doped oxide and relatively higher dielectric constant layers of, for example, fluorine doped oxide (e.g., FSG).

It would therefore be advantageous to develop a method for forming a carbon doped low-k insulating layer in a multiple layer semiconductor device that has improved hardness and cracking resistance while maintaining or lowering a dielectric constant.

It is therefore an object of the invention to present a method for forming a carbon doped low-k insulating layer in a multiple layer semiconductor device that has improved hardness and cracking resistance while maintaining or lowering a dielectric constant while overcoming other deficiencies and shortcomings of the prior art.

SUMMARY OF THE INVENTION

To achieve the foregoing and other objects, and in accordance with the purposes of the present invention, as embodied and broadly described herein, the present invention provides a method forming a dielectric insulating layer with a reduced dielectric constant and increased hardness for semiconductor device manufacturing.

In a first embodiment, the method includes providing a semiconductor wafer having a process surface for forming a dielectric insulting layer thereover; depositing according to a CVD process a carbon doped oxide layer the CVD process including an oregano-silane precursor having Si—O groups and Si—$R_y$ groups, where R is an alkyl or cyclo-alkyl group and y the number of R groups bonded to Si; and, exposing the carbon doped oxide layer to a hydrogen plasma treatment for a period of time thereby reducing the carbon doped oxide layer thickness including reducing the carbon doped oxide layer dielectric constant and increasing the carbon doped oxide layer hardness.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

Figure 1:
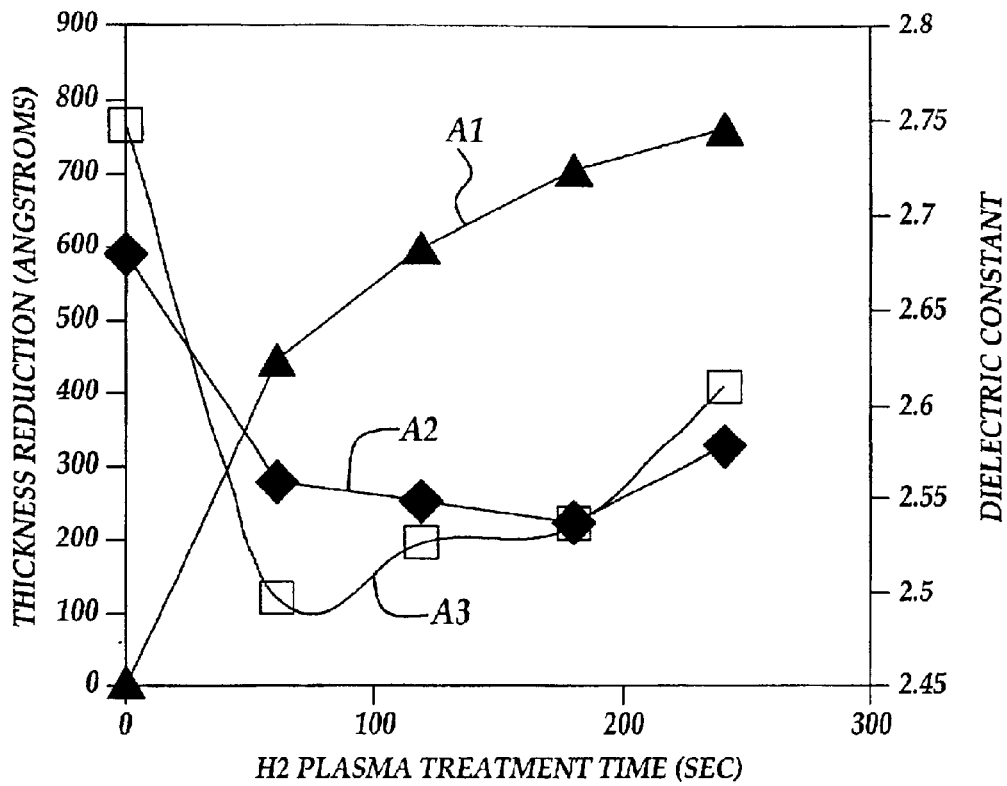
FIG. 1 is a graph representing thickness reduction and dielectric constant changes for a carbon doped oxide dielectric insulating layer according to an embodiment of the present invention.

Although the present invention is explained by reference to a dual damascene process it will be appreciated that the method according to the present invention for forming a low-k dielectric insulating material is not limited to a damascene process or the particular method for forming a dual damascene, for example, a via first process. Rather, the present invention applies to any semiconductor feature manufacturing process where a low-k (<3.0) carbon doped oxide may be advantageously treated according to an embodiment of the present invention to reduce a dielectric constant and increase a hardness and consequently, crack propagation resistance in subsequent stress inducing manufacturing processes. Further, although in making exemplary reference to a damascene process by referring only to a single layer process it will be appreciated that the single layer process may be repeated in multiple levels and layer for forming a multi-level semiconductor device. Moreover, although the exemplary embodiment is explained by reference to a copper filled dual damascene structure, it will be appreciated that other metals, including for example, copper alloys, aluminum, and tungsten metals may advantageously be used as the damascene metal filling.

In a first embodiment of the present invention, a dielectric insulating layer, preferably of carbon doped oxide or oregano silicate glass is formed on a substrate for producing an dielectric insulating layer in a multi-level semiconductor device. Following formation of the dielectric insulating layer the dielectric insulating layer is subjected to a hydrogen plasma to reduce the thickness and dielectric constant of the dielectric insulating layer.

In one embodiment, the carbon doped oxide is formed in a CVD process using oregano-silane precursors. By the term 'oregano-silane', precursors is meant precursors including Si—O groups and Si—$R_y$ groups, where R is an alkyl or cyclo-alkyl group and y the number of R groups bonded to Si. In one embodiment, the R group is a methyl ($CH_3$) group. In another embodiment, the oregano-silane precursor includes a cyclo-tetra-siloxane group including a cyclic arrangement of four Si—O groups. IN a preferred embodiment, the oregano-silane precursor includes at least one of octa-methyl-cyclo-tetra-siloxane and tetra-methyl-cyclo-tetra-siloxane.

In another embodiment, hydrocarbon precursors including for example one or more alkane, alkene, and alkyne gases including, for example, methane, ethane, ethane, acetylene, propane, and propene are added to the gas phase to form an organo-silane precursor mixture in a CVD process to form the to form the carbon doped oxide layer. Preferably, at least one oxygen containing precursor gas is also added to the organo-silane precursor mixture including for example, $O_2$, $O_3$, CO, $CO_2$, $H_2O$ and the like.

In another embodiment, the CVD process is a plasma enhanced CVD (PECVD) process. The process temperature of the substrate may range from about 0° C. to about 450° C., more preferably, about 100° C. to about 350° C. For example, in an exemplary embodiment, gas feeds to a PECVD process chamber include one or more oregano-silane precursors at a flow rate of about 1000–5000 sccm; a hydrocarbon gas at a flow rate of about 100–5000 sccm; and an oxygen-containing precursor at a flow rate of about 100–5000 sccm. RF power is applied in a range of about 100 to 2000 Watts and a process pressure is maintained at about 2 to about 20 Torr. The carbon doped oxide layer is preferably deposited to a thickness of about 500 to about 6000 Angstroms.

In one embodiment, the carbon doped oxide layer is deposited in a multi-step process where a hydrogen plasma treatment as explained below is carried out following each deposition step. For example, if the final thickness of the IMD layer is about 6000 Angstroms, in the multi-deposition process, at least about a ⅓ i.e., 2000 Angstroms of the carbon doped oxide layer is preferably deposited followed by a hydrogen plasma treatment.

Following deposition of the carbon doped oxide layer, in one embodiment of the present invention, the deposited layer is subjected to a hydrogen plasma treatment. Preferably, the hydrogen plasma treatment is a high pressure plasma treatment. By the term 'high pressure' is meant including process pressures from about 10 mTorr to about 50 Torr. The hydrogen plasma treatment is preferably carried out with the substrate temperature from about 0° C. to about 450° C., more preferably, about 350° C. to about 400° C. Hydrogen is added to the PECVD chamber at a flow rate from about 100 to about 1000 sccm, more Preferably, about 400 to about 700 sccm, most preferably about 600 sccm, at a process pressure from about 10 mTorr to about 50 Torr, more Preferably, about 1 to about 10 Torr, most Preferably, about 5 Torr. The hydrogen plasma treatment is carried out for a period of about 20 seconds to about 600 seconds, most Preferably about 60 to about 180 seconds at an RF power of about 100 to about 500 Watts. It is believed the high pressures of the hydrogen plasma treatment together with temperatures allow the hydrogen to diffuse at higher rates throughout the carbon doped layer thereby increasing the thickness over which the hydrogen penetrates. It is believed the hydrogen treatment substitutes hydrogen for oxygen bonds leading to the partial collapse of, for example, Cyclosiloxane structures to increase the carbon doped layer density thereby increasing the carbon doped layer hardness. It is believed the dielectric constant is reduced by replacing a portion of the oxygen with hydrogen. Optionally, an AC or DC bias may be applied to the wafer substrate to assist hydrogen penetration. For example, a low frequency AC bias of about 10 Hz to about 10 kHz or a DC bias may be applied having peak voltage from about 0.5 kV to about 20 kv when depositing thick films.

For example, referring to FIG. 1 is shown a graph of an exemplary hydrogen plasma treatment of a carbon doped oxide layer (IMD layer) where time in seconds is indicated on the horizontal axis. The thickness reduction of the exemplary IMD layer in Angstroms is indicated at the left vertical axis and the dielectric constant of the IMD layer indicated at the right vertical axis. The 'as-deposited' starting thickness of the IMD layer was about 5200 Angstroms. Data line A1 with accompanying data points represents the reduction of thickness in Angstroms of the exemplary IMD layer with hydrogen plasma treatment time. Data lines A2 and A3 represent the dielectric constant of the IMD layer measured as a function of hydrogen plasma treatment time by two different commercially available dielectric constant measurement devices.

As shown in FIG. 1, following the exemplary hydrogen plasma treatment embodiment, it has been found that the dielectric constant of the carbon doped film can be advantageously reduced from about 2.75 to about 2.5 after about 60 seconds of treatment with hydrogen plasma according to one embodiment of the present invention. In other exemplary hydrogen plasma treatments, IMD layers (carbon doped oxide) with an 'as-deposited' dielectric constant of greater than about 2.5 have exhibited reduced dielectric constants following hydrogen plasma treatment to below about 2.5 (e.g., as low as 2.3) with a dielectric constant reduction from about 6 percent to about 9 percent. In addition, it has been found in various exemplary embodiments that a hardness increase of about 33 percent compared to the 'as-deposited' carbon doped oxide can be achieved following the hydrogen plasma treatments according to the preferred embodiments. Consequently, a carbon doped oxide IMD layer with a reduced dielectric constant and an increased hardness is advantageously produced by subjecting one or more carbon doped oxide layers to a hydrogen plasma treatment process according to preferred embodiments of the invention. As a result, the carbon doped oxide layer has improved dimensional stability with increased hardness including a higher resistance to crack initiation and propagation in subsequent processing steps including, for example, CMP.

Referring to FIGS. 2A through 2E are shown cross sectional side view representations of stages in manufacture of a dual damascene structure according to an exemplary embodiment of the present invention. There are several techniques for manufacturing damascene structures including a dual damascene process such as via first fabrication, self-aligned fabrication, and trench first fabrication. In a typical damascene process, for example, a dual damascene manufacturing process known in the art as a via-first process, conventional photolithographic processes using a photoresist layer are first used to expose and pattern an etching mask on the surface of a hard mask layer overlying a low-k dielectric insulating (IND) layer, for etching a via opening through the low-k dielectric insulating layer. Subsequently a similar process is used to define a trench opening that is formed overlying and encompassing the via opening after which a trench opening is anisotropically etched into the IMD layer to include a portion of the via opening. The via opening and trench opening are then subsequently lined with a barrier layer of, for example tantalum nitride, and filled with metal, preferably copper by an electrodeposition process to form visa and trench lines. The surface is then preferably planarized by chemical mechanical planarization (CMP) to remove excess metal and better define the trench lines and prepare the multi-level device for further processing.

Figure 2A:
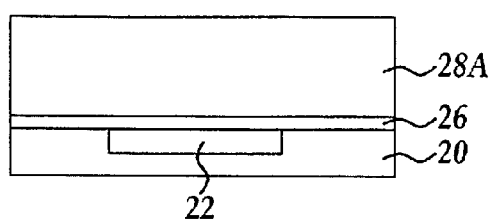
FIGS. 2A-2E are cross sectional side view representations of an exemplary embodiment of the present invention at different steps in a manufacturing process to form an insulating layer in a multiple layer semiconductor device according to an embodiment of the invention.

Referring to FIG. 2A, in an exemplary dual damascene process, for example a via-first process, a substrate 20, for example a dielectric insulating layer having a conductive area 22 is provided, for example, a copper filled trench line. Next, an etching stop layer 26 is provided over the substrate 20 including the conductive area 22 formed of, for example silicon nitride (SiN), silicon oxynitride (SiON) or silicon carbide (SiC) to act as an etching stop in a subsequent operation where via openings are etched through a subsequently deposited overlying low-k dielectric insulating layer, formed preferably of carbon doped oxide, to form closed communication with the conductive area 22. The etching stop layer 26 is typically deposited by chemical vapor deposition using for example, PECVD, or low pressure CVD (LPCVD) to a thickness of about 300 Angstroms to about 1000 Angstroms.

Still referring to FIG. 2A, following deposition of the etching stop layer 26 a first low-k dielectric insulating layer 28A, preferably a carbon doped oxide including the oregano-silane precursors outlined in the preferred embodiments is deposited in a PECVD process to a thickness of about 3000 Angstroms. Following deposition of the first carbon doped oxide layer 28A, the first carbon doped oxide layer is subjected to a hydrogen plasma treatment according to the preferred embodiments.

Figure 2B:
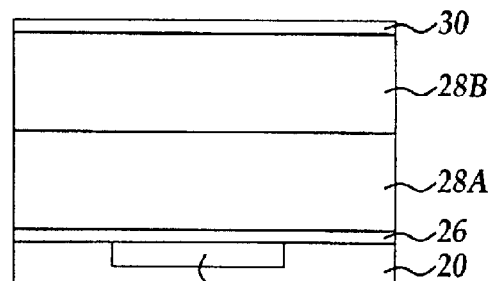

Referring to FIG. 2B, following the hydrogen plasma treatment process, a second carbon doped oxide layer 28B of about 3000 Angstroms is deposited over the first carbon doped oxide layer and subjected to another hydrogen plasma treatment process to complete formation of a first dielectric insulating layer (IMD layer).

It will be appreciated that two dielectric insulating layers (IMD layers) may be used, one for forming the visa therein and one for forming the trench lines therein. It will be further appreciated that if two IMD layers are used, preferably the carbon doped oxide is at least used for the trench line IMD layer as the effects of signal delay capacitance effects are greater for trench line signal propagation. In the case of using two IMD layers it will be appreciated that an etching stop or capping layer may be provided between the IMD layers, for example, formed in the same manner as etching stop layer 26.

Still referring to FIG. 2B, following deposition of the carbon doped oxide layers e.g., 28A, 28B to form the IMD layer, an etching stop layer 30, for example silicon oxynitride or silicon carbide is formed in the same manner as etching stop layer 26 is deposited over the first IMD layer e.g., 28A and 28B. A dielectric anti-reflectance coating (DARC) (not shown), for example silicon oxynitride, is preferably deposited over the etching stop layer 30 to reduce undesired light reflection in subsequent photolithographic patterning processes for producing the via and trench opening. If the etching stop layer is silicon oxynitride, the necessity of a DARC layer is unnecessary as the desired reflective properties at the etching stop layer surface may be adjusted by adjusting the silicon oxynitride processing variables as is known in the art.

Figure 2C:
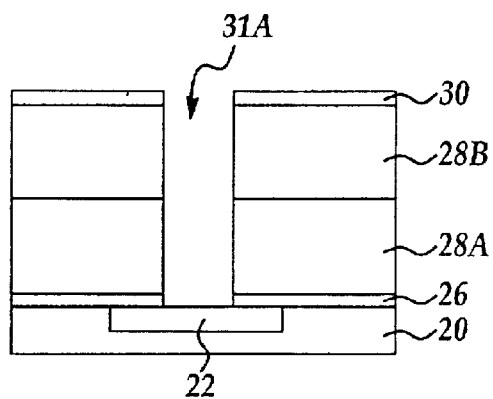

Referring to FIG. 2C, the etching stop layer 30 is photolithographically patterned for anisotropically etching a via opening, for example, by applying a deep ultraviolet (DUV) photoresist overlayer (not shown) active to wavelengths of about 248 nm or less. following photolithographic patterning, a conventional anisotropic plasma etching process including, for example, hydrofluorocarbons and fluorocarbons having a carbon to fluorine ratio of about 2 to about 4 is used to first etch through the etching stop layer 30; through the carbon doped oxide layers 28A and 28B; and through etching stop layer 26 to form a via 31A in closed communication with conductive area 22.

Figure 2D:
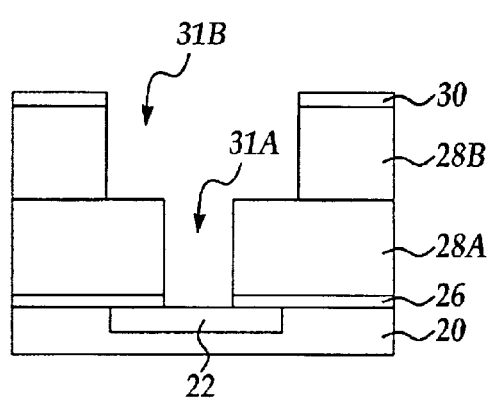

Referring to FIG. 2D, a similar second photolithographic process is then carried out to pattern trench openings overlying and encompassing the via opening 31A. Prior to the trench line patterning process, a polymeric resin may optionally be deposited and etched back to form a via plug (not shown) filling a portion of the via hole to protect the via opening 31A and to prevent out-diffusion of absorbed nitrogen species from the IMD layer capable of interfering with the trench line patterning process. Still referring to FIG. 2D a trench opening is anisotropically etched to form a trench opening 31B overlying and encompassing the via opening to form a dual damascene structure.

Figure 2E:
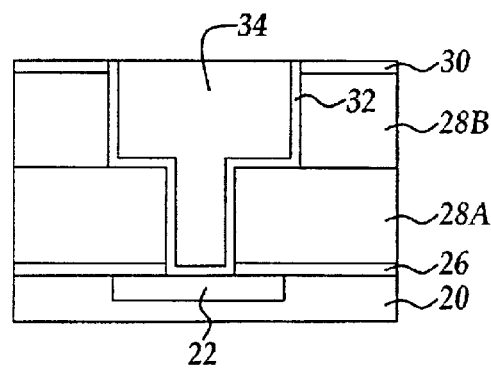

Referring to FIG. 2E, following formation and cleaning of the dual damascene structure to remove residual organic material, the dual damascene structure is filled with, for example, copper filling 34 according to an electro deposition process, and chemically mechanically planarized to complete the formation of a dual damascene. Included in the process is the formation of a barrier/adhesion layer 32, of for example tantalum nitride, followed by deposition of a copper seed layer (not shown) over the wafer surface including the barrier/adhesion layer 32 prior to electrodeposition of copper filling 34. During CMP the barrier layer 32 and a portion of the etching top layer 30 at the wafer surface is polished away.

Figure 3:
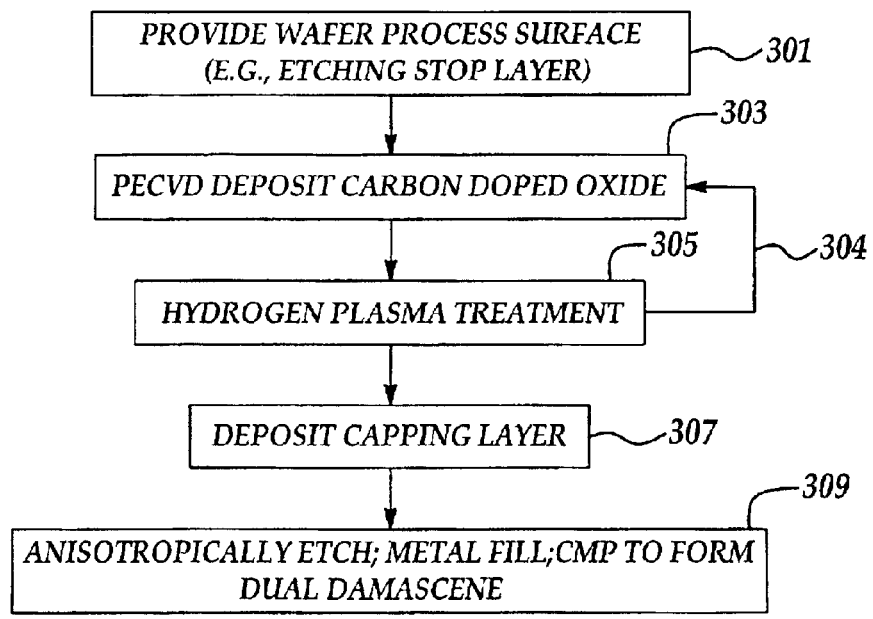
FIG. 3 is a process flow diagram including several embodiments of the present invention.

Referring to FIG. 3 is shown a process flow diagram including several embodiments of the present invention. In process 301, a semiconductor wafer process surface is provided for forming a dielectric insulating layer thereover. In process 303, a carbon doped oxide dielectric insulating layer, preferably formed by a PECVD process including oregano-silane precursors according to preferred embodiments is deposited. In process 305, a hydrogen plasma treatment according to preferred embodiments is carried out to densify the carbon doped oxide and to increase the hardness thereof. As indicated by directional process arrow 304, processes 303 and 305 may optionally be repeated in a multiple layer deposition process to form the dielectric insulating layer (IMD layer). In process 307 a capping layer or etching stop layer is provided over the dielectric insulating layer. In process 309, a dual damascene structure is created including steps of anisotropically etching via and trench lines, filling with metal, preferably copper, and CMP to complete the formation of the dual damascene.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method for forming a dielectric insulating layer with a reduced dielectric constant and increased hardness for semiconductor device manufacturing comprising the steps of:

providing a semiconductor wafer having a process surface for forming a dielectric insulting layer thereover;

depositing according to a plasma enhanced CVD process a carbon doped oxide layer the plasma enhanced CVD process comprising precursor species selected from the group consisting of oregano-silanes and siloxane containing organics; and plasma treating the carbon doped oxide layer with a hydrogen containing plasma at a temperature greater than about 250° C. to reduce a thickness and dielectric constant of the carbon doped oxide layer.

2. The method of claim 1, wherein the siloxane containing organics precursor species comprises a cyclic arrangement of Si—O groups.

3. The method of claim 1, wherein the siloxane containing organics precursor species is selected from the group consisting of octa-methyl-cyclo-tetra-siloxane and tetra-methyl-cyclo-tetra-siloxane.

4. The method of claim 1, wherein the precursor species further comprises hydrocarbon gases selected from the group consisting of methane, ethane, ethene, acetylene, propane, and propene.

5. The method of claim 4, wherein the plasma enhanced CVD process further comprises an oxygen containing species as an oxidant.

6. The method of claim 5, wherein the oxygen containing species is selected from the group consisting of $O_2$, $O_3$, $CO$, $CO_2$, and $H_2O$.

7. The method of claim 1, wherein the carbon doped oxide layer dielectric constant following the step of depositing is less than about 3.0.

8. A The method of claim 1, wherein the hydrogen containing plasma treatment is carried out comprising plasma process conditions including supplying hydrogen at a flow rate of about 100 sccm to about 5000 sccm; a process pressure of about 10 mTorr to about 50 Torr; a process temperature of about 250 degrees Centigrade to about 450 degrees Centigrade; and, supplying an RF energy at a power of about 100 to about 500 Watts.

9. The method of claim 8, wherein the hydrogen containing plasma treatment is carried out comprising plasma process conditions including supplying hydrogen at a flow rate of about 400 sccm to about 800 sccm and a process pressure of about 1 Torr to about 10 Torr.

10. The method of claim 8, wherein the hydrogen containing plasma treatment is carried out from about 10 seconds to about 600 seconds.

11. The method of claim 1, wherein the hydrogen containing plasma treatment is carried out to reduce the carbon doped oxide layer dielectric constant from about 1 percent to about 30 percent.

12. The method of claim 1, wherein the hydrogen containing plasma treatment is carried out to increase the carbon doped oxide layer hardness from about 5 percent to about 50 percent.

13. The method of claim 1, wherein the steps of depositing and plasma treating are sequentially repeated to form a dielectric insulating layer.

14. A method for forming a dielectric insulating layer with a reduced dielectric constant and increased hardness for semiconductor device manufacturing comprising the steps of:

providing a semiconductor wafer having a process surface for forming a dielectric insulting layer thereover;

depositing according to a PECVD process a carbon doped oxide layer the PECVD process comprising siloxane containing precursor species, at least one hydrocarbon gas selected from the group consisting of alkanes, alkenes, and alkynes, and an oxygen containing species selected from the group consisting of $O_2$, $O_3$, $CO$, $CO_2$, and $H_2O$; and plasma treating the carbon doped oxide layer with a hydrogen containing plasma at a temperature greater than about 250° C.

15. The method of claim 14, wherein the siloxane precursor is selected from the group consisting of octa-methyl-cyclo-tetra-siloxane and tetra-methyl-cyclo-tetra-siloxane.

16. The method of claim 14, wherein the carbon doped oxide layer dielectric constant following the step of plasma treating is less than about 3.0.

17. The method of claim 14, wherein the hydrogen containing plasma treatment comprises plasma process conditions including supplying hydrogen at a flow rate of about 400 sccm to about 800 sccm; a process pressure of about 1 Torr to about 10 Torr; and a process temperature of about 250 degrees Centigrade to about 400 degrees Centigrade.

18. The method of claim 17, wherein the hydrogen containing plasma treatment is carried out from about 10 seconds to about 600 seconds.

19. The method of claim 14, wherein the hydrogen containing plasma treatment is carried out to reduce the carbon doped oxide layer dielectric constant to less than about 2.5.

20. The method of claim 1, wherein the hydrogen containing plasma treatment consists essentially of hydrogen.

21. The method of claim 1, wherein the dielectric constant is reduced to less than about 2.5.

22. The method of claim 1, wherein the siloxane containing organics comprises cyclo-siloxanes.

23. The method of claim 14, wherein the hydrogen containing plasma treatment consists essentially of hydrogen.

24. The method of claim 14, wherein the siloxane containing precursor comprises cyclo-siloxanes.

25. The method of claim 14, wherein the siloxane containing precursor is selected from the group consisting of octa-methyl-cyclo-tetra-siloxane and tetra-methyl-cyclo-tetra-siloxane.

26. The method of claim 14, wherein the steps of depositing and plasma treating are sequentially repeated to form a dielectric insulating layer.

* * * * *